(12) United States Patent
Gapiński et al.

(10) Patent No.: US 10,431,437 B2
(45) Date of Patent: Oct. 1, 2019

(54) DETECTING AN ARC OCCURING DURING SUPPLYING POWER TO A PLASMA PROCESS

(71) Applicant: TRUMPF Huettinger Sp. z o. o., Zielonka (PL)

(72) Inventors: Cezary Gapiński, Zielonka (PL); Andrzej Gieraltowski, Zielonka (PL); Adam Grabowski, Zielonka (PL); Piotr Lach, Zielonka (PL); Marcin Zelechowski, Zielonka (PL)

(73) Assignee: TRUMPF Huettinger Sp. z o. o., Zielonka (PL)

( * ) Notice: Subject to any disclaimer, the term of this patent is extended or adjusted under 35 U.S.C. 154(b) by 63 days.

(21) Appl. No.: 15/626,273

(22) Filed: Jun. 19, 2017

(65) Prior Publication Data

US 2017/0287684 A1 Oct. 5, 2017

Related U.S. Application Data

(63) Continuation of application No. PCT/EP2015/079863, filed on Dec. 15, 2015.

(30) Foreign Application Priority Data

Dec. 19, 2014 (EP) .................................. 14461600

(51) Int. Cl.
*H01J 37/32* (2006.01)

(52) U.S. Cl.
CPC .............. *H01J 37/32944* (2013.01)

(58) Field of Classification Search
None
See application file for complete search history.

(56) References Cited

U.S. PATENT DOCUMENTS 5,718,813 A * 2/1998 Drummond ............. H01J 37/34
204/192.12
6,621,674 B1 9/2003 Zahringer et al.
(Continued)

FOREIGN PATENT DOCUMENTS

CN 101843178 A 9/2010
CN 101983255 A 3/2011
(Continued)

OTHER PUBLICATIONS

International Search Report for PCT Application No. PCT/EP2015/079863, dated Mar. 21, 2016, 3 pages.
(Continued)

*Primary Examiner* — Dion Ferguson
*Assistant Examiner* — Srinivas Sathiraju
(74) *Attorney, Agent, or Firm* — Fish & Richardson P.C.

(57) ABSTRACT

Methods, apparatus and systems for detecting an arc during supplying a plasma process in a plasma chamber with a power are provided. An example plasma power supply includes: a DC source, an output signal generator, a first signal sequence measurement device for measuring a first signal sequence present between the DC source and the output signal generator, a second signal sequence measurement device for measuring a second signal sequence present at an output of the output signal generator, and a controller configured to generate a reference signal sequence based on one of the first and second signal sequences, to compare the reference signal sequence and the other of the first and second signal sequences that has not been used to determine the reference signal sequence, and to generate a detection signal if the reference signal sequence and the other of the first and second signal sequences cross.

20 Claims, 3 Drawing Sheets

(56) References Cited

U.S. PATENT DOCUMENTS

| | | | | |
|---|---|---|---|---|
| 6,995,545 | B2* | 2/2006 | Tracy | H01J 37/32082 322/19 |
| 7,009,406 | B2* | 3/2006 | Naidu | G01R 31/025 324/536 |
| 7,514,936 | B2* | 4/2009 | Anwar | G01R 31/1254 324/464 |
| 8,264,237 | B2* | 9/2012 | Coumou | H01J 37/32935 156/345.28 |
| 8,332,170 | B2* | 12/2012 | Lee | G01J 3/02 702/66 |
| 8,395,078 | B2* | 3/2013 | Ilic | H01J 37/32045 204/192.12 |
| 8,506,771 | B2 | 8/2013 | Horishita et al. | |
| 8,581,597 | B2* | 11/2013 | Coumou | G01R 19/0061 156/345.28 |
| 8,786,263 | B2* | 7/2014 | Ozimek | H01J 37/32091 323/266 |
| 8,815,329 | B2* | 8/2014 | Ilic | H01J 37/32935 204/192.13 |
| 8,837,100 | B2* | 9/2014 | Bulliard | H01J 37/32045 361/79 |
| 9,129,779 | B2* | 9/2015 | Booth | H01J 37/32935 |
| 9,153,421 | B2* | 10/2015 | Booth | H01J 37/32935 |
| 9,214,801 | B2* | 12/2015 | Bulliard | H01J 37/32045 |
| 9,313,870 | B2* | 4/2016 | Walde | H05H 1/24 |
| 9,355,824 | B2* | 5/2016 | Kadlec | H01J 37/3444 |
| 9,386,680 | B2* | 7/2016 | Chen | H01J 37/32082 |
| 9,484,189 | B2* | 11/2016 | Winterhalter | H01J 37/32431 |
| 9,613,784 | B2* | 4/2017 | Klein | H01J 37/32027 |
| 9,685,297 | B2* | 6/2017 | Carter | H01J 37/32944 |
| 9,842,726 | B2* | 12/2017 | Daniels | H01J 37/32091 |
| 10,002,749 | B2* | 6/2018 | Grede | H01J 37/32944 |
| 2006/0049831 | A1 | 3/2006 | Anwar et al. | |
| 2007/0073498 | A1 | 3/2007 | Winterhalter et al. | |
| 2008/0121625 | A1 | 5/2008 | Zaehringer | |
| 2008/0309402 | A1* | 12/2008 | Ozimek | H01J 37/32091 327/593 |
| 2009/0308734 | A1 | 12/2009 | Krauss | |
| 2011/0040508 | A1* | 2/2011 | Lee | G01J 3/02 702/66 |
| 2011/0140607 | A1* | 6/2011 | Moore | A61B 18/042 315/111.21 |
| 2013/0073241 | A1* | 3/2013 | Coumou | G01R 19/0061 702/81 |
| 2015/0069912 | A1* | 3/2015 | Valcore, Jr. | H03J 7/00 315/111.21 |
| 2015/0354052 | A1* | 12/2015 | Bugyi | C23C 14/0042 204/192.22 |
| 2016/0237554 | A1* | 8/2016 | Kadlec | H01J 37/3444 |
| 2016/0268108 | A1* | 9/2016 | Daniels | H01J 37/32091 |
| 2017/0287684 | A1* | 10/2017 | Gapinski | H01J 37/32944 |

FOREIGN PATENT DOCUMENTS

| | | | | |
|---|---|---|---|---|
| DE | 102013202428 | | 8/2014 | |
| DE | 102013110883 | B3 * | 1/2015 | H01J 37/32917 |
| EP | 1121705 | | 8/2001 | |
| EP | 2156505 | | 2/2010 | |
| EP | 1928009 | B1 | 4/2013 | |
| EP | 2905802 | | 8/2015 | |
| GB | 2468430 | B * | 12/2012 | G01R 19/0061 |
| WO | WO2005096344 | A1 | 10/2005 | |
| WO | WO 2006116445 | A2 * | 11/2006 | H01J 37/32082 |
| WO | WO 2014/124857 | | 8/2014 | |
| WO | WO 2017095586 | A1 * | 6/2017 | H01J 37/32082 |

OTHER PUBLICATIONS

Notice of Granting Patent Right for Invention in Chinese Application No. 201580073917.7, dated Mar. 5, 2019, 8 pages (with English translation).

Office Action in Chinese Application No. 201580073917.7, dated Sep. 28, 2018, 10 pages (English translation).

* cited by examiner

DETECTING AN ARC OCCURING DURING SUPPLYING POWER TO A PLASMA PROCESS

CROSS-REFERENCE TO RELATED APPLICATIONS

This application is a continuation of and claims priority under 35 U.S.C. § 120 to PCT Application No. PCT/EP2015/079863 filed on Dec. 15, 2015, which claims priority to European Application No. 14 461 600.0, filed on Dec. 19, 2014. The entire contents of these priority applications are incorporated herein by reference.

TECHNICAL FIELD

The invention relates to methods, apparatus, and systems for detecting an arc occurring during supplying power to a plasma process in a plasma chamber.

BACKGROUND

The coating of substrates, e.g., glass, by cathode sputtering in plasma processes is well known. The sputtering can be done conventionally or using a reactive gas. In the case of using a reactive gas for sputtering, it is called reactive sputtering. To that end, a current or voltage source produces a plasma, which removes material from a target. The removed material is then coated on the substrate, e.g., a glass substrate. If a reactive process is used, the target atoms can combine with gas atoms or molecules, depending on the desired coating.

In particular, if reactive processes are being used, arcs can occur in the plasma process. Such arcs can be detrimental to the plasma process and can even destroy the coating. Therefore, it is necessary to detect arcs quickly and reliably. Often, arcs are detected by monitoring the output voltage of the power supply. In some cases, if there is a rapid fall in the output voltage, an arc is detected. In some cases, the current can be monitored. If there is an instant rise in the output current, this is also indicative of an arc. In particular, output current and output voltage can be monitored and compared to a threshold value respectively. However, the output current and the output voltage may change during plasma processing for other reasons, e.g., without an arc occurring.

The power supply may be a current regulated and/or a voltage regulated and/or a power regulated power supply. Setpoint values for current, voltage or power are given from outside, for example by a user. The power supply is then regulated to achieve the setpoint values at the output. If, for example, the power supply is in the power regulation mode with a desired setpoint for the power, a maximum setpoint for the current, and a maximum setpoint for the voltage, it is difficult to determine a good threshold value for arc detection, because the absolute value for voltage or current are varying with plasma impedance. Hence, if a fixed threshold value is used to detect arcs, arc detection is not very reliable.

SUMMARY

Implementations of the present invention provide methods, controllers, and power supplies for detecting an arc occurring during supplying power to a plasma process in a plasma chamber, which allow faster and more reliable arc detection.

One aspect of the present invention features a method of detecting an arc occurring during supplying power to a plasma process in a plasma chamber, including the following method steps:

a. determining a first signal sequence present between a DC (direct-current)-source and an output signal generator by a first signal sequence measurement device;

b. determining a second signal sequence present at an output of the output signal generator by a second signal sequence measurement device;

c. determining a reference signal sequence based on one of the first and second signal sequences;

d. comparing the reference signal sequence with the other of the first and the second signal sequences which has not been used in determining the reference signal sequence;

e. detecting an arc if the reference signal sequence and the other of the first and second signal sequences cross.

Hence, according to the invention different signals are being used for generating the reference signal sequence and for comparing with the reference signal sequence to determine if an arc has occurred. Such a method is much more reliable than the methods used according to the state of the art. In particular, false arc detection can very often be avoided. Crossing of a signal sequence and the reference signal sequence can be the signal sequence rising above the reference signal sequence or the signal sequence falling below the reference signal sequence.

At least one of the first signal sequence, the second signal sequence, and the reference signal sequence may be digitized or determined in the digital domain. This allows digital signal processing, which leads to faster arc detection.

To improve the detection of arcs, the reference signal sequence may be determined in regular intervals. For example, the reference signal sequence may be determined in intervals of several milliseconds, microseconds or nanoseconds. Furthermore, the reference signal sequence may be determined at the same clock rate as the clock rate supplied to a control unit or an integer value divisor of the clock rate.

A current, voltage or power may be measured as the first or second signal sequence.

The determined first and/or second signal sequence may be an average value, an effective value or a maximum value. Depending on the kind of plasma process being used, it can be chosen, what kind of value should be used as the first and/or second signal sequence. An average value may be calculated over several periods of the clock signal supplied to control unit.

The time elapsed after crossing of the other of the first and second signal sequences and the reference signal sequence may be measured, and if the other of the first and second signal sequences and the reference signal sequence do not cross again within a predetermined time interval, an arc is detected. Thus, arc detection can be improved. In particular, a crossing of the other of the first and second signal sequences and the reference signal sequence does not automatically and immediately lead to an arc detection signal. If the arc is sustained and present for a long enough time interval, an arc is detected.

The reference signal sequence may be determined to be the measured first or second signal sequence minus a first given value or may be determined to be the first or second signal sequence multiplied by a second given value.

Another aspect of the present invention features a controller for a plasma power supply for supplying a plasma process in a plasma chamber with a power, the power supply including a DC source and an output signal generator. The controller is supplied with a first signal sequence present between the DC-source and the output signal generator and a second signal sequence present at an output of the output signal generator. The controller includes:

i. a reference signal sequence determining unit (or a reference signal sequence generator), configured to generate a reference signal sequence based on one of the first and second signal sequences;

ii. a comparator, configured to compare the reference signal sequence and the other of the first and second signal sequences which has not been used to determine the reference signal sequence, and to generate a detection signal if the reference signal sequence and the other of the first and second signal sequences that has not been used for determining the reference signal sequence cross.

Such a controller may include a digital control unit, for example, a digital signal processor or a field-programmable gate array (FPGA). Thus, very fast signal processing and therefore fast arc detection can be obtained.

As mentioned before, the controller may be a digital control, which may be clocked with a given clock.

The controller may include a counter that measures a time elapsed after the other of the first and second signal sequences and the reference signal sequence cross. Thus, eliminating false arc detection can be improved.

The controller may include an arc detection device (or an arc detector) configured to generate an arc detection signal based on the comparator detecting the crossing of the reference signal sequence and the other of the first and second signal sequences and/or a given time having elapsed after the crossing of the reference signal sequence and the other of the first and second signal sequences without the other of the first and second signal sequences and the reference signal sequence crossing again.

A further aspect of the present invention features a plasma power supply for supplying a plasma process in a plasma chamber with a power, including:

a. a DC source;
b. an output signal generator connected to the DC source;
c. a first signal sequence measurement device for measuring a first signal sequence present between the DC source and the output signal generator;
d. a second signal sequence measurement device for measuring a second signal sequence present at the output of the output signal generator;
e. a controller according to the invention, which is connected to the first and second signal sequence measurement devices.

The first signal can be taken at any point between the output of the DC-source and the input of the output signal generator. The first signal sequence or the second signal sequence may be a current, voltage or power.

The plasma power supply may include an averaging unit (or an average generator) for determining an average of the first signal sequence and/or an average of the second signal sequence. Alternatively, the plasma power supply may include an effective value determining unit (or an effective value generator) for determining an effective value of the first signal sequence and/or the second signal sequence. As a further alternative, the plasma power supply may include a maximum value determining unit (or a maximum value generator) for determining a maximum value of the first signal sequence and/or the second signal sequence within a given time interval.

The foregoing and other objects, features and advantages of the invention as well as the invention itself, will be more fully understood from the following illustrative description, when read together with the accompanying drawings, which are not necessarily to scale.

DETAILED DESCRIPTION

Figure 1:
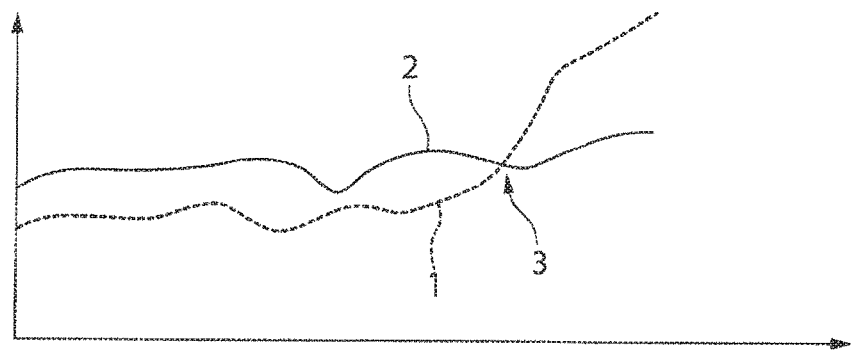
FIG. 1 is a diagram explaining arc detection with a reference signal sequence.

FIG. 1 shows a reference signal sequence 1, which has been obtained from a signal sequence measured either at an output of a plasma power supply, e.g., at an output of an output signal generator, or between a DC source and an output signal generator of a plasma power supply. Reference numeral 2 shows a signal sequence of a signal obtained at the output of the plasma power supply or between the DC source and the output signal generator of the plasma power supply. However, the signal sequence 2 is not the signal sequence which has been used for obtaining the reference signal sequence 1. It can be seen that at point 3 signal sequence 2 crosses the reference signal sequence 1, in particular falls below the reference signal sequence 1. This means that an arc has occurred in a plasma chamber, where a plasma process takes place.

Figure 2:
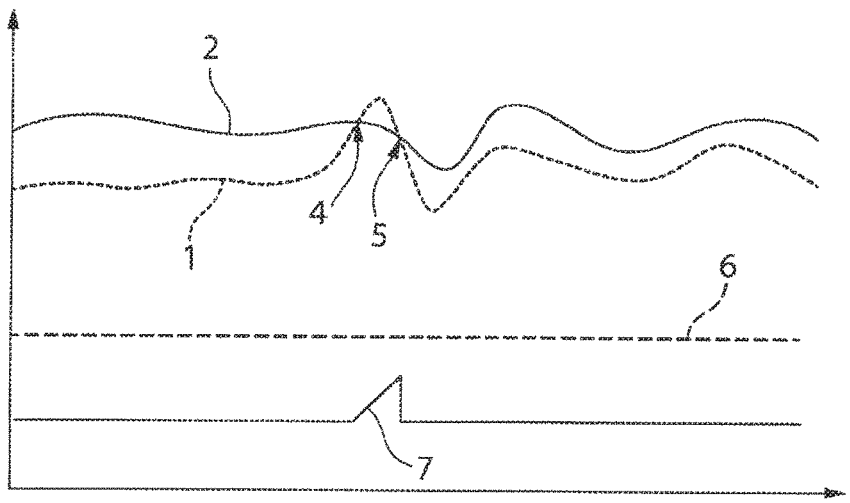
FIG. 2 is a diagram explaining false arc detection.

A similar situation is shown in FIG. 2. In this case, the reference signal sequence 1 and the signal sequence 2 cross at points 4, 5. In this case only a relatively small or short arc has occurred, which extinguishes without external interference. Such an arc does not greatly affect the plasma process and a counter arc measure should not be initiated if such an arc occurs. To avoid false arc detection, the time between points 4 and 5 is measured. This is shown by line 7 that is an output signal of a counter. The counter receives an output of a comparator comparing the reference signal sequence 1 and the signal sequence 2. Once the comparator indicates a crossing of the reference signal sequence 1 and the signal sequence 2, e.g., at point 4, the output signal (line 7) of the counter starts to rise. The rising of the output signal of the counter is a measure of the time elapsed after point 4. At point 5, the comparator indicates another crossing of the reference signal sequence 1 and the signal sequence 2. This leads to resetting of the counter and hence to a low output signal of the counter (line 7). Only if line 7 crosses another line 6 representing a threshold value, which indicates that an arc has been present, for a long enough time, an arc detection signal is generated and a counter arc measure is initiated. If, as shown in FIG. 2, the arc is relatively short and line 7 stays below line 6, no real arc is detected and no counter arc measure is initiated.

Figure 3:
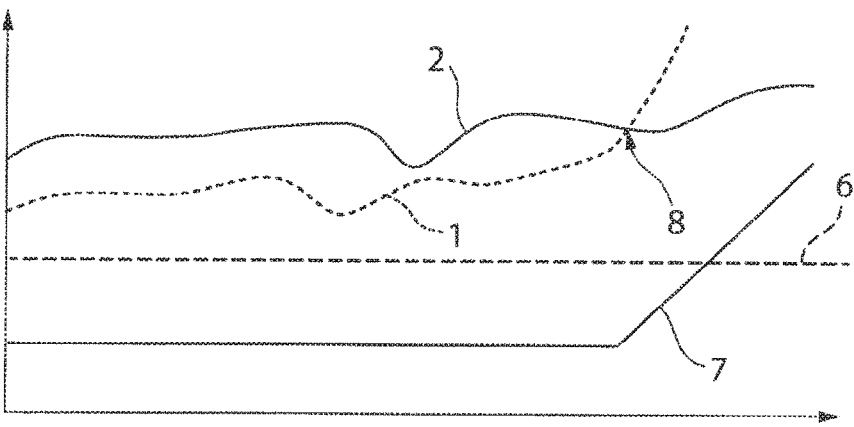
FIG. 3 is a diagram showing how false arc detection can be avoided.

FIG. 3 shows a similar situation to FIG. 2. In this case, the reference signal sequence 1 and the signal sequence 2 cross at point 8. At point 8, a time measurement is started. This again is indicated by line 7. In this case, however, in contrast to the situation in FIG. 2, the signal sequence 2 stays below the reference signal sequence 1 for such a long time that line 7 crosses line 6. Therefore, an arc detection signal is generated and a counter arc measure can be initiated.

The equivalent to measuring a time in the analog domain is starting to increase a counter when the signal sequence 2 and the reference signal sequence 1 cross for the first time. This counter is increased or decreased as long as the reference signal sequence 1 and the signal sequence 2 do not cross again. If the counter is increased or decreased up to a given value (e.g., a threshold value), an arc is detected.

Figure 4:
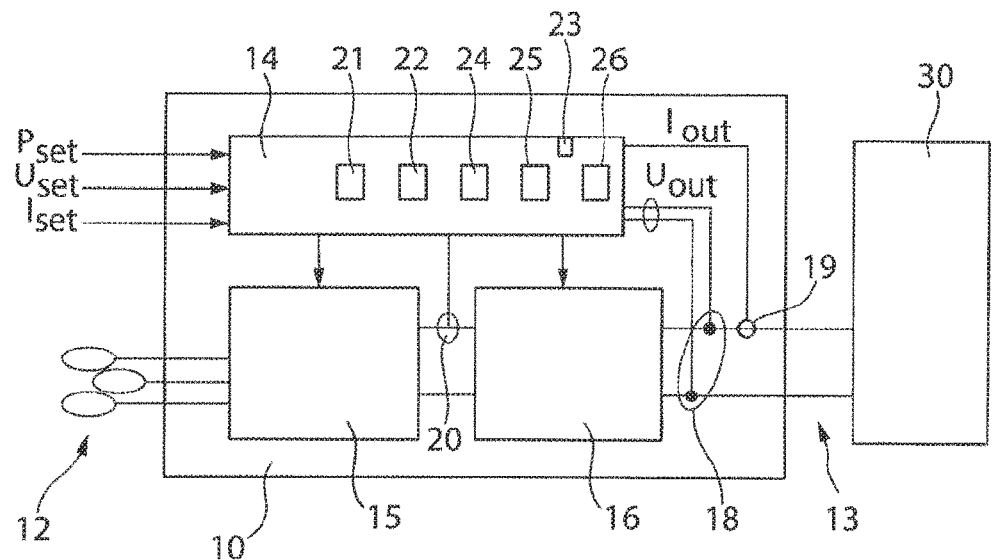
FIG. 4 is a block diagram of a plasma power supply.

FIG. 4 shows a plasma power supply 10 configured to receive a supply voltage from a supply grid 12. The plasma power supply 10 generates output signal sequences at its output 13. Output signal sequences can be an output current Iout and an output voltage Uout. Multiplying output voltage and output current can result in an output power Pout, which is also considered an output signal sequence.

The power supply 10 includes a control and arc detection unit (or a controller) 14, which receives as an input setpoints for the output power Pset, for the output voltage Uset and for the output current Iset. Furthermore, the plasma power supply 10 includes a DC-source 15. The DC-source 15 is connected to an input of output signal generator 16, e.g., a bridge inverter. The output signal generator 16 can be also controlled by the control and arc detection unit 14.

In addition to signal measuring devices 18, 19 at the output of the output signal generator 16, a measuring device 20 is provided for measuring a signal present between the DC-source 15 and the output signal generator 16. The signal measuring mean 18, 19, or 20 can include a current detector, a voltage detector, or a power detector.

The control unit 14 can include a reference signal sequence determining unit 21, configured to generate a reference signal sequence based on a signal measured at the output of the output signal generator 16 by at least one of the measuring devices 18, 19 or a signal measured between the DC-source 15 and the output signal generator 16, e.g., the signal measured by the measuring device 20.

Furthermore, the control unit can include a comparator 22 configured to compare the reference signal sequence and the signal sequence that has not been used to determine the reference signal sequence, and to generate a detection signal if the reference signal sequence and the signal sequence not used for determining the reference signal sequence cross.

The control unit 14 may be a digital control unit (or a digital controller), which is clocked at a given clock. To that end, the control unit 14 can include a clock input 23.

Furthermore, the control unit 14 can include a counter 24 that measures a time elapsed after the signal sequence and the reference signal sequence have crossed.

Furthermore, the control unit 14 can include an arc detection device 25 that generates an arc detection signal based on the signals generated by the comparator 22 and/or the counter 24, e.g., based on detecting the reference signal sequence and the signal sequence crossing and/or a given time having elapsed after the crossing of the reference signal sequence and the signal sequence without the signal sequence and the reference signal sequence crossing again.

In addition, the control unit 14 can include a unit 26. The unit 26 can include an averaging unit (or an average generator) for determining an average of a signal sequence, an effective value determining unit (or an effective value generator) for determining an effective value of a signal sequence, and/or a maximum value determining unit (or a maximum value generator) for determining a maximum value of a signal sequence.

Furthermore, the output signal generator 16 is connected to a plasma chamber 30, which is supplied with power by the plasma power supply 10. In the plasma chamber 30 a plasma process takes place. Arcs may occur in the plasma process.

Figure 5:
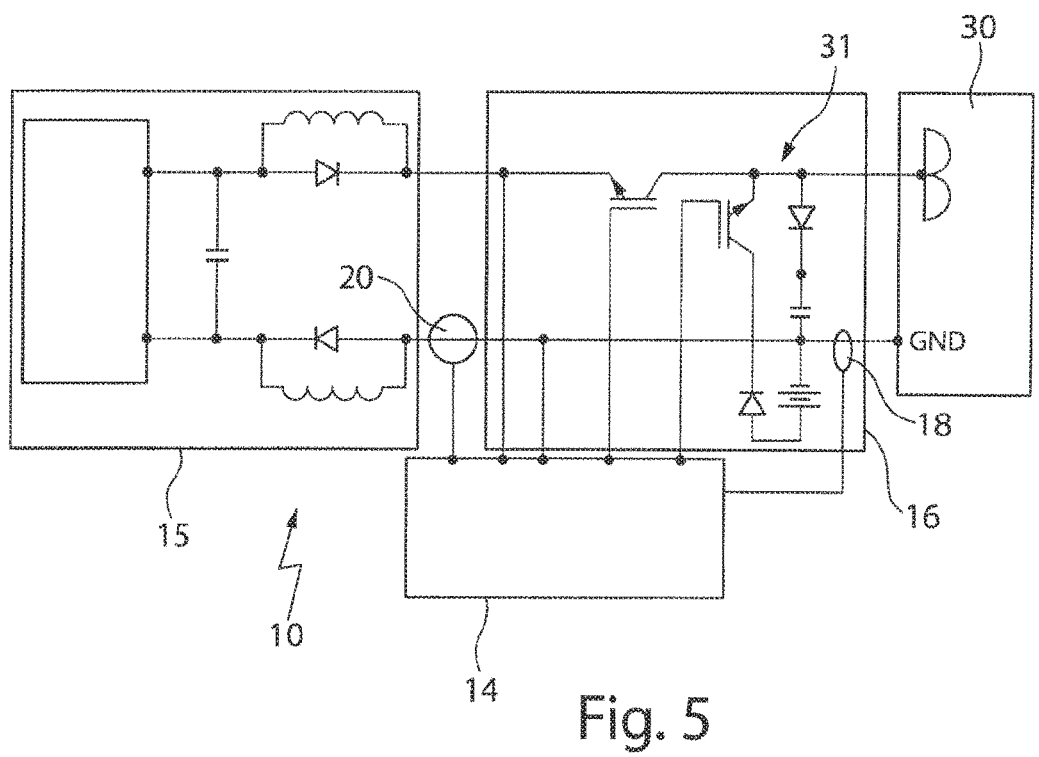
FIG. 5 is a diagram of an alternative plasma power supply.
Figure 6:
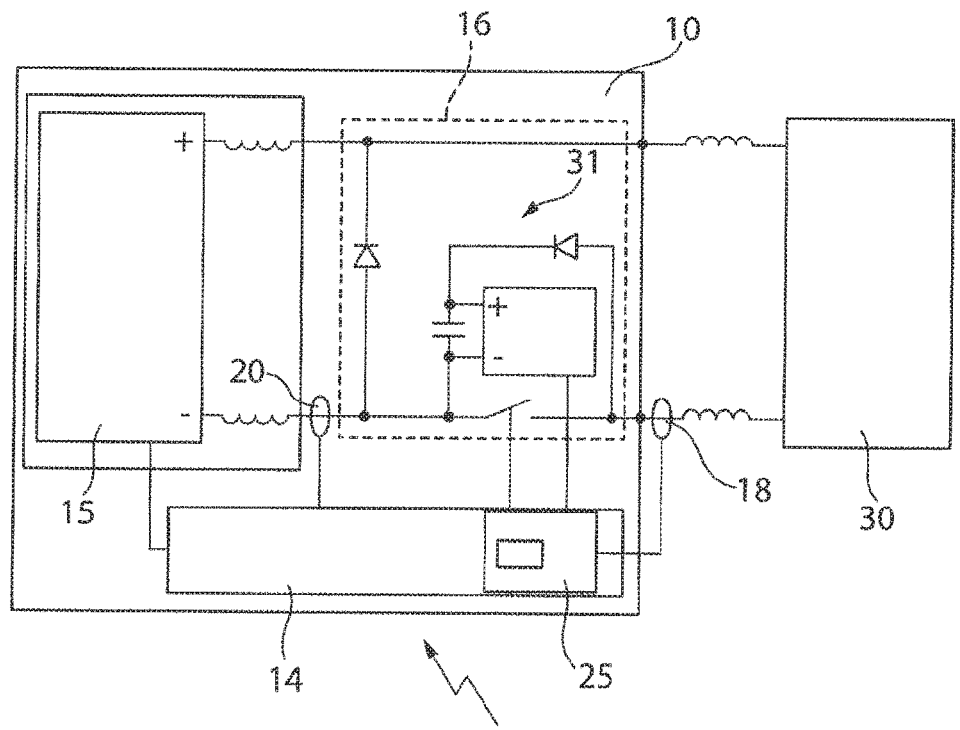
FIG. 6 is another example of a plasma power supply.
Figure 7:
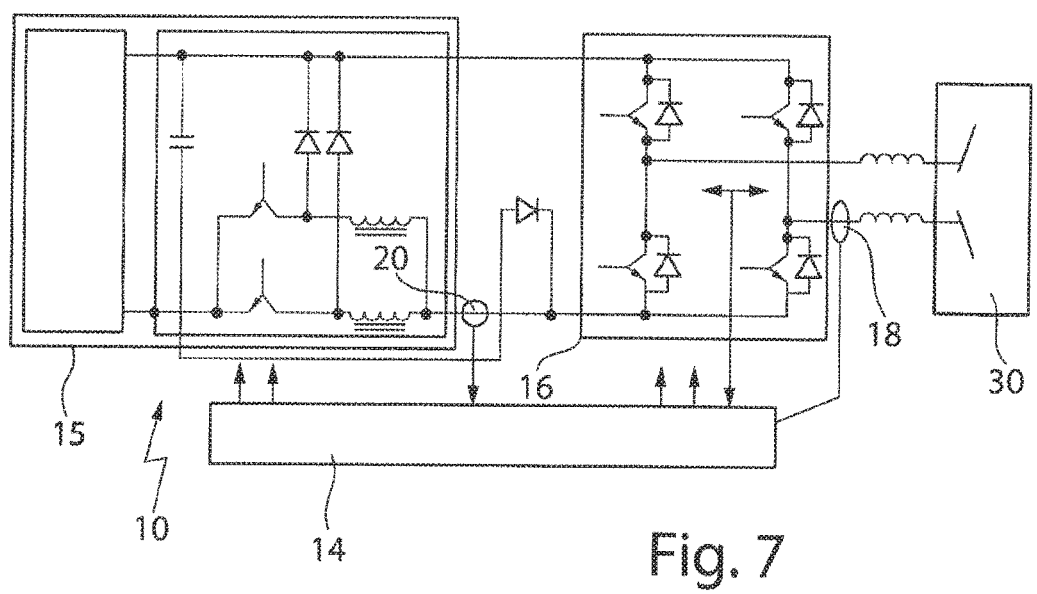
FIG. 7 is yet another example of a plasma power supply.

FIGS. 5, 6, and 7 show alternative embodiments of a plasma power supply 10 and plasma chamber 30, where elements corresponding to elements described above have the same reference numerals.

In FIG. 5, the output signal generator 16 is not embodied as an inverter, but as a DC-signal source.

In FIGS. 5 and 6, the output signal generator 16 includes an extinguishing unit (or an extinguisher) 31 for extinguishing an arc, which is connected to the arc detection device 25.

In the embodiment shown in FIG. 7, the output signal generator 16 is embodied as a full bridge inverter feeding the plasma process with bipolar power and the reference signal sequence is obtained at the output of the output signal generator 16 by the measuring means 18.

The output signal generator 16 may be an inverter such as a full bridge or a full bridge with an output transformer or an additional output resonant circuit. The plasma process in the plasma chamber 30 may in that case be a Middle-Frequency (MF) powered plasma process as shown in FIGS. 4 and 7. In such an MF powered plasma process the determined first and/or second signal sequence may be an average value or an effective value, e.g., a root mean square (RMS) value.

The output signal generator 16 may be a pulsing unit (or a pulser). Additionally or alternatively, the output signal generator 16 may include a unit 31 for extinguishing an arc. The plasma process in the plasma chamber 30 may in that case be a pulsed DC powered plasma process as shown in FIGS. 5 and 6. In such a pulsed DC powered plasma process the determined first and/or second signal sequence may be an average value or a maximum value.

The control and arc detection unit 14 in FIGS. 5, 6, and 7 may also include one or more of the following units or devices, although they are not shown in these figures: reference signal sequence determining unit 21, comparator 22, clock input 23, counter 24, arc detection device 25, and a unit 26.

A number of embodiments of the invention have been described. Nevertheless, it will be understood that various modifications may be made without departing from the spirit and scope of the invention. Accordingly, other embodiments are within the scope of the following claims.

What is claimed is:

1. A method of detecting an arc occurring during supplying power to a plasma process in a plasma chamber, comprising:
   determining a first signal sequence present between a DC source and an output signal generator, wherein the output signal generator comprises an input connected to the DC source and an output connected to the plasma chamber;
   determining a second signal sequence present at the output of the output signal generator;
   determining a reference signal sequence based on one of the first and second signal sequences;
   comparing the reference signal sequence with the other of the first and second signal sequences; and
   detecting an arc by determining if the reference signal sequence and the other of the first and second signal sequences cross.

2. The method of claim 1, wherein at least one of the first signal sequence, the second signal sequence and the reference signal sequence, is digitized in a digital domain.

3. The method of claim 1, wherein the reference signal sequence is determined in periodic intervals.

4. The method of claim 1, wherein at least one of the first signal sequence and the second signal sequence comprises one of a current, a voltage, and a power.

5. The method of claim 1, wherein at least one of the first signal sequence and the second signal sequence comprises one of an average value, an effective value, and a maximum value.

6. The method of claim 1, comprising:
measuring a time elapsed after determining the crossing of the other of the first and second signal sequences and the reference signal sequence; and
determining that an arc is detected if the other of the first and second signal sequences and the reference signal sequence do not cross again within the measured elapsed time being no smaller than a predetermined time interval.

7. The method of claim 1, further comprising:
generating an arc detection signal in response to determining that the arc is detected.

8. The method of claim 1, wherein determining a reference signal sequence comprises determining the reference signal sequence to be one of:
the one of the first and second signal sequences minus a first given value, and
the one of the first and second signal sequences multiplied by a second given value.

9. A plasma power supply for supplying a plasma process in a plasma chamber with a power, the plasma power supply comprising:
a DC source;
an output signal generator comprising an input connected to the DC source and an output connected to the plasma chamber;
a first signal sequence measurement device for measuring a first signal sequence present between the DC source and the output signal generator;
a second signal sequence measurement device for measuring a second signal sequence present at the output of the output signal generator; and
a controller connected to the first and second signal sequence measurement devices and configured to receive the first signal sequence and the second signal sequence, the controller comprising:
a reference signal sequence generator configured to generate a reference signal sequence based on one of the first and second signal sequences, and
a comparator configured to compare the reference signal sequence and the other of the first and second signal sequences that has not been used to determine the reference signal sequence, and to generate a detection signal if the reference signal sequence and the other of the first and second signal sequences cross.

10. The plasma power supply of claim 9, wherein the controller is a digital controller configured to be clocked with a given time interval.

11. The plasma power supply of claim 9, wherein the controller comprises a counter configured to measure a time elapsed after the other of the first and second signal sequences and the reference signal sequence cross.

12. The plasma power supply of claim 9, wherein the controller comprises an arc detection device configured to generate an arc detection signal based on the detection of the crossing of the reference signal reference and the other of the first and second signal sequence.

13. The plasma power supply of claim 12, wherein the arc detection device is configured to generate the arc detection signal if the reference signal sequence and the other of the first and second signal sequences do not cross again within a given time interval elapsed after the crossing of the reference signal sequence and the other of the first and second signal sequences.

14. The plasma power supply of claim 12, wherein the output signal generator comprises an extinguisher connected to the arc detection device and configured to extinguish an arc.

15. The plasma power supply of claim 9, wherein the output signal generator comprises at least one of:
a DC-signal source,
a bridge inverter, and
a pluser.

16. The plasma power supply of claim 9, further comprising an effective value generator configured to generate at least one of:
an effective value of the first signal sequence, and
an effective value of the second signal sequence.

17. The plasma power supply of claim 9, further comprising a maximum value generator configured to generate at least one of:
a maximum value of the first signal sequence within a first given time interval, and
a maximum value of the second signal sequence within a second given time interval.

18. The plasma power supply of claim 9, wherein the reference signal sequence generator is configured to determine the reference signal sequence to be one of:
the one of the first and second signal sequences minus a first given value, and
the one of the first and second signal sequences multiplied by a second given value.

19. A device for a plasma power supply for supplying a plasma process in a plasma chamber with a power, the device comprising:
a reference signal sequence generator configured to generate a reference signal sequence based on one of a first signal sequence present between a DC source and an input of an output signal generator that is connected to the DC source and a second signal sequence present at an output of the output signal generator that is connected to the plasma chamber, the plasma power supply including the DC source and the output signal generator; and
a comparator configured to:
compare the reference signal sequence and the other of the first and second signal sequences which has not been used to determine the reference signal sequence, and
generate a detection signal if the reference signal sequence and the other of the first and second signal sequences cross.

20. The device of claim 18, further comprising an arc detection device configured to generate an arc detection signal by
determining that the reference signal sequence and the other of the first and second signal sequence cross, and
determining that the reference signal sequence and the other of the first and second signal sequences do not cross again within a given time interval elapsed after the crossing of the reference signal sequence and the other of the first and second signal sequences.

* * * * *